United States Patent [19]
Kroll

[11] 3,747,210
[45] July 24, 1973

[54] METHOD OF PRODUCING TERMINAL PINS OF A PRINTED CIRCUIT BOARD

[75] Inventor: Heinz E. J. Kroll, Heroldsberg, Germany

[73] Assignee: International Standard Electric Corporation, New York, N.Y.

[22] Filed: Sept. 13, 1971

[21] Appl. No.: 179,927

[52] U.S. Cl. .................... 29/630 R, 29/624, 29/625, 29/630 B, 117/212, 174/68.5, 204/15
[51] Int. Cl. .............................................. H05k 3/04
[58] Field of Search ...................... 29/625, 626, 624, 29/630 B; 204/15; 117/212; 174/68.5

[56] References Cited

UNITED STATES PATENTS

| | | | |
|---|---|---|---|
| 2,783,193 | 2/1957 | Nieter | 204/15 |
| 3,167,490 | 1/1965 | Friedman | 204/15 |
| 3,200,210 | 8/1965 | Alonas et al. | 29/630 B |
| 3,434,208 | 3/1969 | Todmeg et al. | 204/15 X |
| 3,518,756 | 7/1970 | Bennett et al. | 204/15 X |

*Primary Examiner*—Richard J. Herbst
*Assistant Examiner*—Joseph A. Walkowski
*Attorney*—C. Cornell Remsen, Jr., Thomas E. Kristofferson et al.

[57] ABSTRACT

A simple method of completely metallizing terminal pins in a pattern-like arrangement. The pins protrude from the side edge of a printed circuit board. After punching out the terminal pins, there are left elevated connecting parts between the pins which then together with the connecting parts receive a metal coating. Then these connecting parts are punched off in order to interrupt the electric connection between the terminal pins.

7 Claims, 5 Drawing Figures

METHOD OF PRODUCING TERMINAL PINS OF A PRINTED CIRCUIT BOARD

The present invention relates to a method of producing the terminals of a printed circuit board in a pattern-like arrangement. The terminals are produced by being punched out of the printed circuit board in the shape of pins, studs, fingers, or the like. Such types of circuit boards are, in particular, suitable for use as the contact boards of rotary and sliding switches intended for installation in communications equipment and electronic apparatus employing printed circuits.

BACKGROUND OF THE INVENTION

As a rule, the electrical connection between terminals of a printed contact board and the conductors of a printed circuit is established by way of soldering. For this purpose, through-plated, metallized bores are provided between the conductor leads of the printed circuit, into which the pin-shaped terminal parts of the contact board are inserted and soldered in position. Relative thereto, efforts are made for safeguarding the establishment of the connection of the terminal parts to the conductor leads both electrically and mechanically. The soldering in position of the terminal parts can be carried out economically only by employing a dip soldering method in the course of which the terminal parts projecting out of the plug-in holes of the circuit boards are simultaneously dipped in great numbers into a soldering bath. This dipping is carried out in such a way that the solder will reliably surround all parts of the terminals. Performance of such a soldering, however, entails difficulties because the terminal parts of the contact board are only metallized on one or two sides depending on the position of the contact leads on the contact board.

It is the object of the present invention to effect the all around metallization of the individual pin-shaped terminal parts of a printed circuit board, in order to improve the later soldering of the terminal parts into a printed circuit. In the course of manufacturing all around metallized terminal parts of a circuit board, however, it is relatively difficult to avoid the metallization between the bound ends of the terminal parts. Thus, the terminal parts are connected to one another in an electrically conducting manner, which, is undesirable in most cases.

The invention provides a solution as to how these difficulties can be overcome. Thus, during the punching-out of the terminal parts, there are left over elevated connecting parts at the bound ends thereof. At the punched-out boundary surfaces, and all boundary surfaces of the terminal parts, electrically conducting metal coating is applied. Then, the metallized coating is partly punched off so as to interrupt the electrical connection between the respective metallized terminal parts.

The advantages of the invention, both as to its construction and mode of operation, will be readily appreciated as the same becomes better understood by reference to the following detailed description when considered in connection with the accompanying drawings in which like referenced numerals designate like parts throughout the figures.

DESCRIPTION OF THE PREFERRED EMBODIMENT

Figure 1:
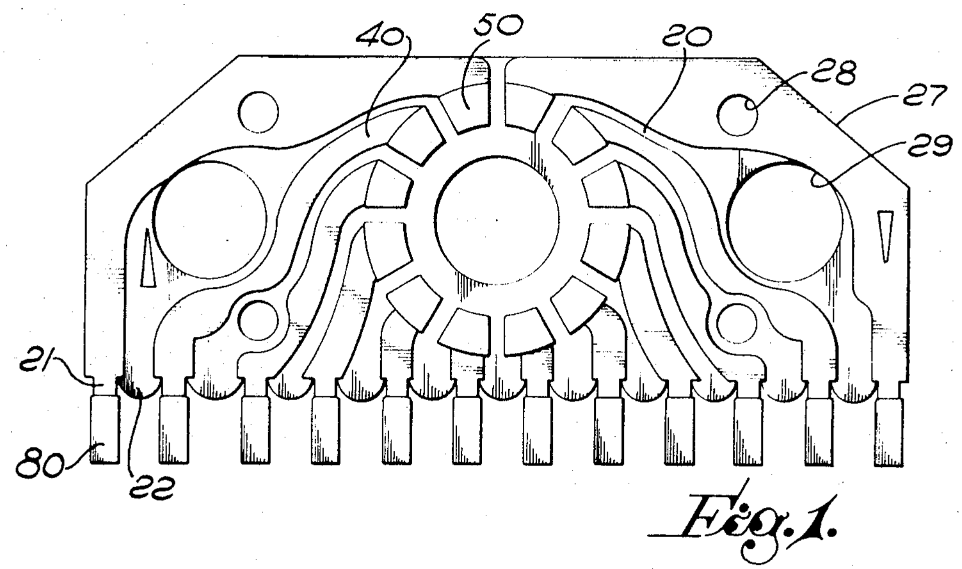
FIG. 1, in a top view, shows a contact board with partly finished terminal parts manufactured in accordance with the operational steps proposed by the invention.
Figure 3:
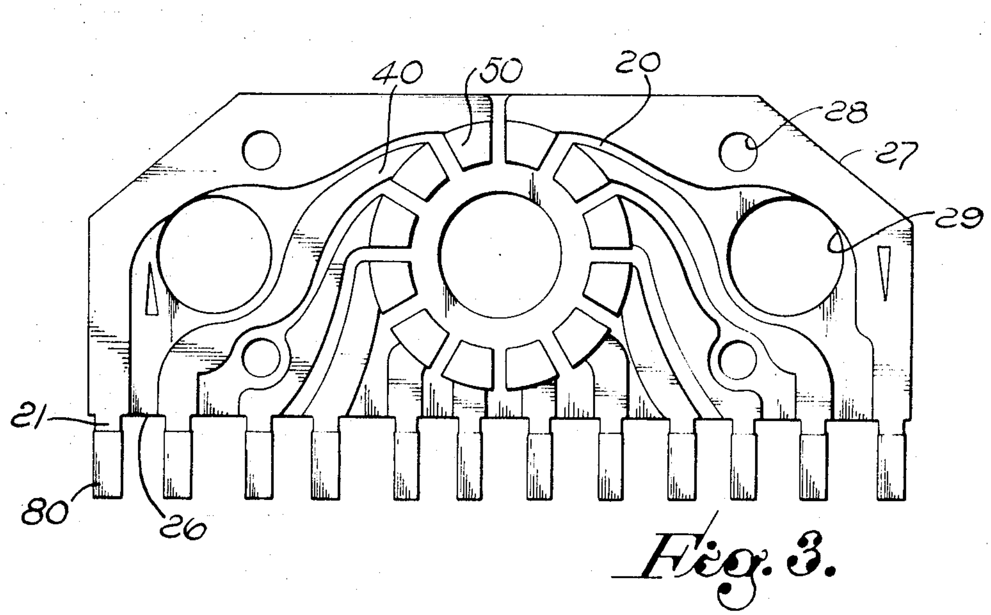
FIG. 3, in a top view, shows the contact board with the finished terminal parts manufactured in accordance with the inventive method.
Figure 5:
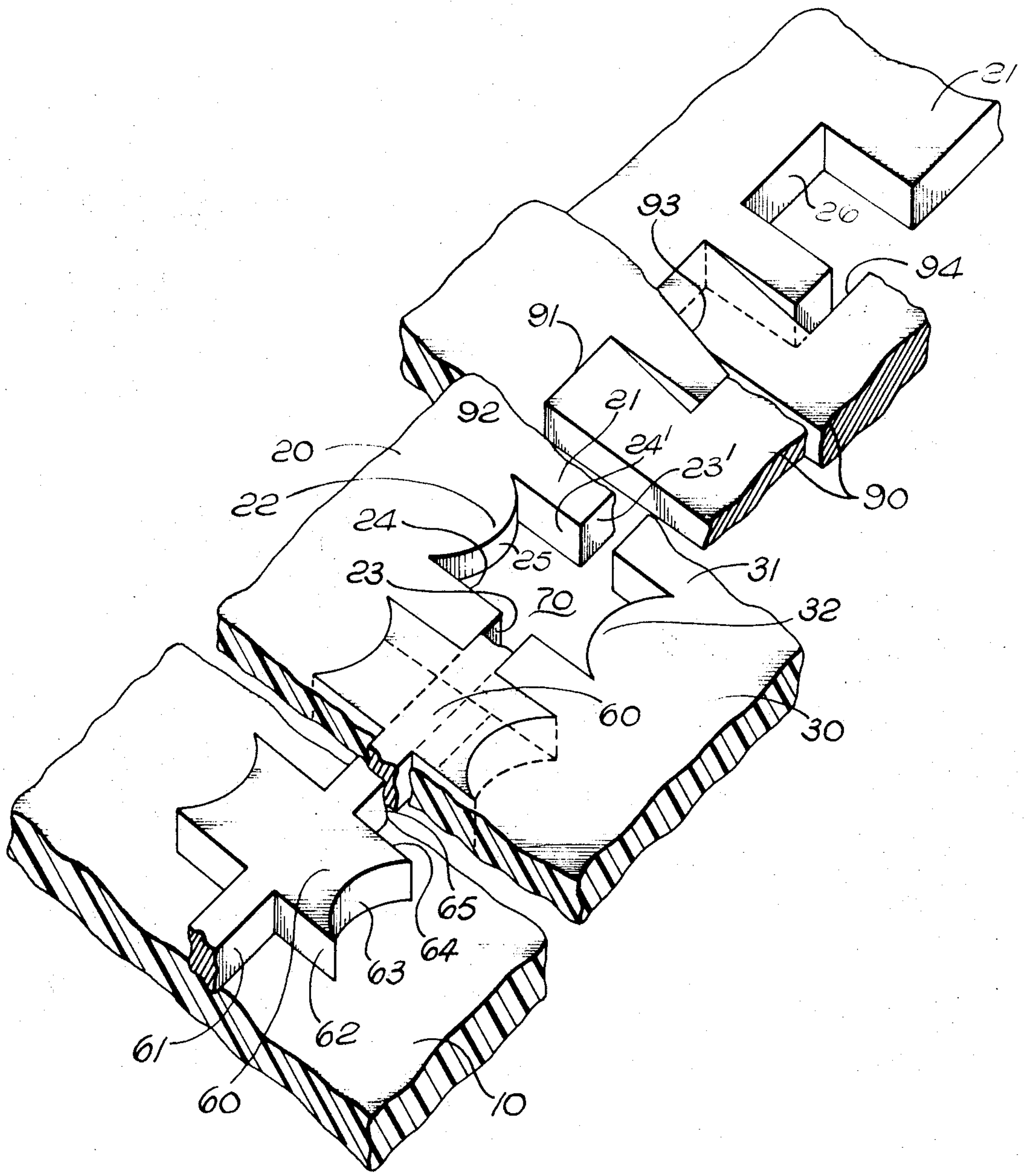
FIG. 5, in a schematical representation, shows the individual successive operational steps of the method according to the invention.

Referring now to the drawings, there is shown starting and supporting material 10 for the contact board 20 of FIG. 1 and 30 of FIG. 5. The board may be made of laminated plastics supported with various fillers, and provided with a desired conductor pattern, as well as with conductor leads 40 and switch contacts 50 which may also be of the blade type. The contact board 20, as shown in FIGS. 1 and 3, forms part of a rotary switch (not shown) intended for installation in a printed circuit. The conductor leads 40 and the switch contacts 50 can be produced by employing known methods, such as the so-called printing-etching method, or the photographic etching method, respectively. Relative thereto, the surface of the switch contacts 50 may be galvanically coated with a refining layer, such as silver or gold. Such refined parts will then satisfy the special requirements which have to be placed on switch contacts.

Relative thereto, it is well known that corrosion resistance and resistance to wear, play a preferred part. Moreover, the conductor pattern can be precipitated in a chemical bath without external current application, as is likewise known from the fields of manufacturing printed circuits. The coppering solution used in this method only precipitates copper at the cutting edges or at those points which have previously been provided with a catalyst. Reinforcement of this coating can likewise be effected chemically, and also galvanically. This additive method, as is well known, is also used for manufacturing through-plated bores. For example, in such a method the bores of laminated plastics boards are coppered chemically until reaching a thickness of lamination of about 1 um, whereupon these copper coatings are galvanically reinforced.

Upon manufacturing the conductor pattern, the terminal parts 21, 31 are punched out of the starting and supporting materials 10 in a pattern-like arrangement. In the left-hand portion of FIG. 5, the punching tool required may be advantageously designed in such a way that simultaneously the terminal parts 21,31 of two contact boards 20,30 can be made from the starting and supporting material 10. Preferably, the punching tool required to this end, consists of a substantially cross-shaped punch 60 with boundary surfaces 61, 62, 63, 64, 65 disposed in a mirror-imaged arrangement. Instead of one single punch 60, it is advantageously possible to use a punching tool consisting of several individual punches 60, for permitting the punch holes 70 to be manufactured in the course of one operation.

Figure 2:
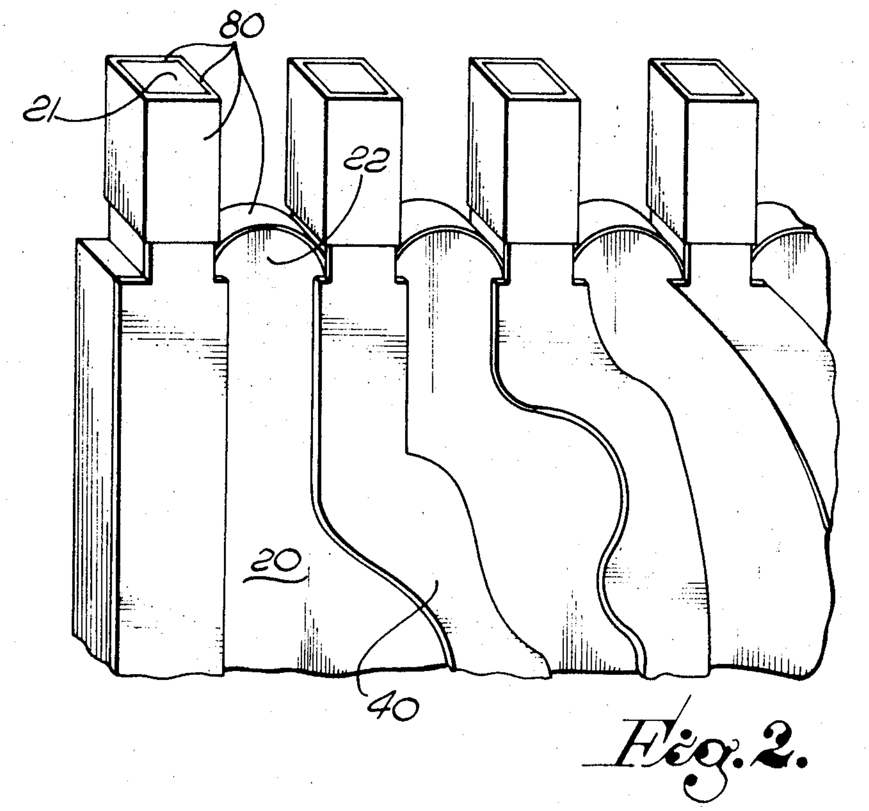
FIG. 2, in a perspective enlarged-scale representation, shows one section of this contact board, containing the terminal parts.

When punching out the terminal parts 21, 31 elevated connecting parts remain of substantially semicircular shape at the bound ends thereof. Correspondingly, the punch 60 is provided with oppositely arranged inwardly arched boundary surfaces 63 of preferably semicircular contour. The punched-out boundary surfaces 23, 23', 24, 24' of the contact board 20, as well as the remaining boundary surfaces of its terminal parts 21 are then provided with a metal coating 80, as is clearly evident in FIG. 2. By employing a dipping method, metal is deposited or precipitated in a chemical bath without external current application and, consequently, without causing any contacting problems.

For this purpose, a coppering solution is used to achieve a particularly reliable adherence of the precipitation without coupling agents and catalysts. The first copper precipitation has a thickness of 1 um, and is followed for reinforcement by further precipitations of copper effected by galvanic coppering. A galvanically produced copper coating, for improving solderability and corrosion resistance, may be covered with a refining and/or solderable metal layer, such as a gold or tin layer applied galvanically.

Figure 4:
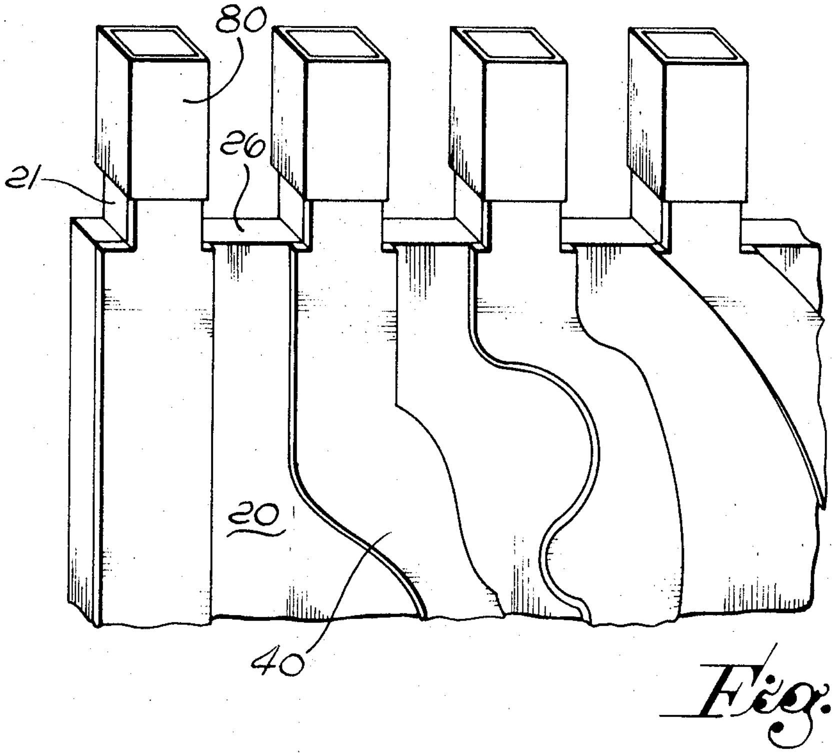
FIG. 4, again in a perspective, enlarged-scale representation, shows one section of this contact board containing the finished terminal parts.

Upon manufacturing the copper plating or the gold or tin layer positioned thereon respectively, there exists an unwanted electrical connection between the terminal parts 21 or 31. Consequently, between the individual conductor leads 40 or the switch contacts 50, the connecting parts 22 or 32, between the terminal parts receive a metal coating when being metallized by way of dipping. Therefore, the elevated connecting parts 22 or 32 must be removed by a correspondingly shaped punching tool, so that plain, non-metallized connecting surfaces 26 will result between the terminal parts 21 or 31, as is shown in the right-hand portion of FIG. 5, and in FIG. 4.

For effecting the punching off, an angular punch 90, having a cutting surface 91 extending vertically in relation to the terminal parts 21 or 31, is used. The cutting surface 91 removes the semicircular connecting parts 22 or 32 together with the respective metal coating 80 by way of punching, whereas the remaining boundary surfaces 92, 93, 94 of the punch have a certain clearance with respect to the boundary surfaces 24, 24', 23 of the terminal part 21. Again, it is possible to combine several such punches 90 to form one punching tool. Moreover, it may be advantageous to perform the punching off of the connecting parts 22 or 32 in the course of one operation, simultaneous with that of manufacturing the inner and outer contours of the contact plate 20 or 30. For example, the holes 28, for receiving clamping bolts, can be manufactured simultaneously. These bolts serve the clamping of two oppositely arranged contact boards 20, 30 to form one self-supporting switch unit with the rotor lying therebetween.

Furthermore, it is possible to simultaneously punch the holes 29 for threading several such switch units on to bolts. These switch units are then capable of being axially displaced. Finally, in the course of this step of operation, may also be formed the outer contour 27 of the contact boards 20,30.

What is claimed is:

1. A method of producing the terminal parts of a printed circuit board in a pattern-like arrangement comprising the steps of:

punching out the terminal parts along an edge of a printed circuit board with elevated connecting parts left over at said edge between said terminal parts, applying an electrically conducting metal coating to the punched out boundary surfaces of said elevated connecting parts together with all boundary surfaces of the terminal parts, and punching off part of said coated elevated connecting parts to interrupt the electrical connection between the terminal parts.

2. A method according to claim 1, wherein said elevated connecting parts are produced to have an almost semicircular shape.

3. A method according to claim 1, wherein said metal coating is applied chemically by way of dipping.

4. A method according to claim 3, wherein said chemically applied metal coating is reinforced by a galvanically produced metal layer.

5. A method according to claim 4, wherein said that the galvanically produced metal layer is covered with a refining and solderable layer.

6. A method according to claim 3, wherein at first there is applied a chemically produced copper coating, said coating being galvanically reinforced, and that thereupon the reinforced copper coating is galvanically covered with a layer of gold or tin.

7. A method according to one of claim 1, wherein in the course of one operation, the elevated connecting parts are punched off and both the inner and the outer contours of the circuit board are produced.

* * * * *